US006762447B1

(12) United States Patent
Mandelman et al.

(10) Patent No.: US 6,762,447 B1
(45) Date of Patent: Jul. 13, 2004

(54) FIELD-SHIELD-TRENCH ISOLATION FOR GIGABIT DRAMS

(75) Inventors: Jack A. Mandelman, Stormville, NY (US); Rama Divakaruni, Middletown, NY (US); Giuseppe Larosa, Fishkill, NY (US); Ulrike Gruening, Wappingers Falls, NY (US); Carl Radens, LaGrangeville, NY (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/245,269

(22) Filed: Feb. 5, 1999

(51) Int. Cl.[7] .................. H01L 27/108; H01L 29/00
(52) U.S. Cl. .................. 257/301; 257/302; 257/303; 257/505; 257/513; 257/514
(58) Field of Search .................. 257/301, 302, 257/303, 505, 504, 506, 513, 514, 374, 446, 544, 510, 559, 296, 306, 307, 308, 499, 520, 330–333, 906, 907, 908; 438/242, 243, 386, 259, 270–295, 253, 254, 396, 398

(56) References Cited

U.S. PATENT DOCUMENTS

| | | | |
|---|---|---|---|
| 4,845,051 A | * | 7/1989 | Cogan et al. .............. 438/193 |
| 5,179,038 A | * | 1/1993 | Kinney et al. |
| 5,306,940 A | * | 4/1994 | Yamazaki |
| 5,523,593 A | * | 6/1996 | Kagaya et al. |
| 5,557,135 A | | 9/1996 | Hashimoto .............. 257/308 |
| 5,801,423 A | * | 9/1998 | Manning |
| 6,020,250 A | * | 2/2000 | Kenney |
| 6,274,919 B1 | * | 8/2001 | Wada .............. 257/508 |

OTHER PUBLICATIONS

"Effects of a New Trench–Isolated Transistor Using Sidewall Gates" by Hieda et al., from IEEE Transactions of Electron Devices, vol., 36, No. 9, Dated Sep. 1989, pp. 1615–1619.

\* cited by examiner

Primary Examiner—Wael Fahmy
Assistant Examiner—DiLinh Nguyen
(74) Attorney, Agent, or Firm—Lerner, David, Littenberg, Krumholz & Mentlik, LLP

(57) ABSTRACT

A dynamic random access memory (DRAM) formed in a semiconductor body has individual pairs of memory cells that are isolated from one another by a vertical electrical isolation trench and are isolated from support circuitry. The isolation trench has sidewalls and upper and lower portions, and encircles an area of the semiconductor body which contains the memory cells. This electrically isolates pairs of memory cells from each other and from the support circuitry contained within the semiconductor body but not located within the encircled area. The lower portion of the isolation trench is filled with an electrically conductive material that has sidewall portions thereof which are at least partly separated from the sidewalls of the lower portion of the trench by a first electrical insulator, and that has a lower portion that is in electrical contact with the semiconductor body. The upper portion of the isolation trench is filled with a second electrical insulator.

15 Claims, 6 Drawing Sheets

FIELD-SHIELD-TRENCH ISOLATION FOR GIGABIT DRAMS

FIELD OF THE INVENTION

This invention relates to dynamic random access memories (DRAMS), and more particularly, to the use of field shield isolation in DRAMs.

BACKGROUND OF THE INVENTION

A particularly important integrated circuit device is the DRAM that comprises an array of memory cells arranged in rows and columns in a semiconductor body (chip, substrate) and word lines and bit lines over the surface of the chip to write in and read out bits stored in individual cells. Each memory cell generally includes a switch, typically an n-channel metal-oxide-semiconductor field effect transistor (MOSFET), in series with a storage capacitor.

In DRAM technology there is a continuing drive to increase the density of memory cells in the chip. This generally involves both a reduction in the size of individual memory cells and closer packing of the memory cells in the chip. The effect of the smaller memory cell size and closer memory cell packing results in undesirable problems with short and narrow channel effects in the transistor of the memory cell.

To meet these problems, it is the usual practice to increase the doping of a p-type well formed at the surface of the chip wherein are formed the n-channel MOSFETS that typically serve as the switches of the memory cells. However, the increase in p-type conductivity well doping tends to increase the junction leakage of the transistors. This degrades the retention time of the stored bits stored in the storage capacitor. This in turn requires more frequent refreshing of the stored information and this reduces the time during which the memory operates productively. Additionally, there is evidence that the increased electric field resulting in the semiconductor body resulting from the increase in p-type well doping electrically activates the silicon defects that are inherent in the silicon body (substrate). Still another problem that arises with closer packing is that the narrower shallow trenches needed for isolation tend to have a higher aspect ratio. This leads to increased silicon stress and greater concentration of silicon defects. These factors all tend to increase the array leakage that result in arrays with closer cell packing and smaller cell size.

Field-shield isolation was a popular isolation technique in the art of n-channel metal-oxide-semiconductor (NMOS) integrated circuits because it was relatively easy to implement when the standard technology for integrated circuits was pure NMOS technology that used only n-channel MOSFETS. However, NMOS technology has been largely supplanted by complementary MOS (CMOS) technology which uses both n-channel and p-channel MOSFETs to lower power dissipation. As a result of this technology shift, field-shield isolation in ICs was largely replaced by LOCOS (Local Oxidation of CMOS) and STI (Shallow Trench Isolation). This was because field-shield isolation is difficult to use with the CMOS technology since the n-channel and p-channel transistors require opposite polarity field-shield electrical bias, complicating the wiring of the mixed field-shield regions in the regions of complementary circuitry.

It is characteristic of DRAMS that, although they use n-channel and p-channel MOSFETS, the use of p-channel MOSFET (denoted as PMOS technology) is typically limited to the support circuitry that is used for addressing, sensing, and refreshing the memory cells and that this support circuitry is localized at the periphery of the chip. However, the main central area of the chip is used only for the array of memory cells that use only NMOS technology. Moreover, in those instances where PMOS is used instead for the transistors of the memory cells, the use of NMOS transistors is then generally limited to the support circuitry at the chip periphery.

In an article entitled "Effects of a New trench-isolated Transistor Using Sidewall Gates", by Katsuhiko Hieda et al., IEEE Transaction on Electron Devices, Vol. 36, N. 9, September 1989, there is described the use of a trench formed in a semiconductor substrate. The trench is lined with a layer of silicon dioxide. Subsequently a lower portion of the trench is filed with polysilicon and an upper portion of the trench is filled with silicon dioxide. The polysilicon in the trench electrically floats in potential which can reduce the electrical isolation nominally provided by this type of trench isolation.

U.S. Pat. No. 5,557,135 (M. Hashimoto), issued Sep. 17, 1996, shows a type of field shield which uses a polysilicon filled trench which is dielectrically isolated from a substrate and is electrically connected via a top portion thereof to a voltage supply to electrically isolate n-channel FETS. The top connection increases the area of silicon needed and therefore undesirably increases the cost of the resulting chip. The extension of the polysilicon to the top of the trench increases capacitances of the memory cell.

SUMMARY OF THE INVENTION

The present invention exploits this characteristic of DRAMs that the central area where the memory cells are localized generally uses only one of NMOS or PMOS technology, rather than CMOS technology. Moreover, when the transistors are n-channel MOSFETs, they are typically formed in a p-type conductivity well. When the transistors are p-channel MOSFETs, they are then formed in a n-type conductivity well. Typically the top portion of the well is of a conductivity lower than the deep portion of the well.

The present invention uses for cell isolation a combination of the prior art silicon oxide shallow trench isolation (STI) and prior art doped-polysilicon field-shield isolation in which the doped field-shield polysilicon underlies the silicon oxide in the trench and is used to isolate the deeper part of well. Accordingly, the silicon oxide portion of the STI can be shallower that in the prior art technology. Moreover, the isolation provided by the doped polysilicon is made active, rather than passive, because it is maintained at an appropriate bias by being conductively connected to the monocrystalline silicon in the well, which is doped to be of like conductivity-type, and so can be more effective than the silicon oxide of the standard STI. Moreover, because the deeper portion of the isolation trench is filled with doped polysilicon, a lessor depth of silicon oxide needs to be deposited. This facilitates the filling of isolation trenches with high aspect ratios. Moreover, the doped polysilicon in the isolation trench provides a better thermal match to the surrounding monocrystalline silicon than does silicon oxide. This should reduce the number of silicon defects induced in the monocrystalline silicon, with a consequent reduction in the accompanying leakage. The height of the doped polysilicon in the isolation trench advantageously should be such as not to extend upwards enough to overlap bit-line diffusions near the chip surface so that bit-line capacitance due to the polysilicon shield can be negligible. The field shield is maintained at the potential of the deeper, generally more conductive, portion of the well, this forcing the potential of the nearby well silicon surfaces to produce active isolation.

Viewed from an apparatus aspect, the present invention is directed to a semiconductor body containing a semiconductor structure. The semiconductor body defines an isolation trench having sidewalls and upper and lower portions, and encircling an area of the semiconductor body which contains a semiconductor structure which is to be electrically isolated from other semiconductor structures contained within the semiconductor body but not located within the encircled area. The lower portion of the isolation trench is at least partly filled with an electrically conductive material that has sidewall portions thereof which are at least partly separated from the sidewalls of the lower portion of the trench by a first electrical insulator, and that has a lower portion that is in electrical contact with the semiconductor body. The upper portion of the isolation trench being filled with a second electrical insulator.

Viewed from an other apparatus aspect, the present invention is directed to a dynamic random access memory. The dynamic access memory comprises a plurality of memory cells and an isolation trench. The plurality of memory cells are arranged in rows and columns in active areas of a semiconductor body with the active areas being separated from one another by a continuous isolation trench in the semiconductor body. The isolation trench has side walls and upper and lower portions. The lower portion of the isolation trench is filled with an electrically conductive material that has sidewall portions thereof which are at least partly separated from the sidewalls of the lower portion of the trench by a first electrical insulator, and that has a lower portion thereof that is in electrical contact with the semiconductor body. The upper portion of the isolation trench is filled with a second electrical insulator.

Viewed from still an other apparatus aspect, the present invention is directed to a dynamic random access memory. The dynamic access memory comprises a memory portion and a peripheral portion. The memory portion comprises a plurality of memory cells arranged in rows and columns in active areas of a semiconductor body with each memory cell comprising a transistor of one conductivity type and a storage capacitor, and with the active areas being electrically isolated from one another by a first isolation trench in the semiconductor body having a lower portion filled with doped polysilicon and an upper portion filled with an electrical insulator. The lower portion of the doped polysilicon fill makes electrical contact with the semiconductor body, and sidewall portions of the doped polysilicon fill are electrically isolated from portions of sidewalls of the lower portion of the trench by an electrical insulating layer. The peripheral portion comprises circuits which at least comprise one transistor of the one conductivity type and one transistor of an opposite conductivity type in the semiconductor body with circuits of the periphery portion being electrically isolated from one another by a second isolation trench in the semiconductor body that is filled with an electrical insulator.

Viewed from still an other aspect, the present invention is directed to a dynamic random access memory. The random access memory comprises an array of memory cells formed in a well of one conductivity type in a silicon chip and arranged in rows and columns with each memory cell including a transistor and a storage capacitor and a continuous isolation trench. The continuous isolation trench is formed in the well for electrically isolating from one another, within the well, pairs of individual memory cells. The continuous isolation trench has an upper portion that is filled with a dielectric material and a lower portion that is filled with polysilicon doped to be of the conductivity type of the well. A lower portion of the doped polysilicon fill makes electrical contact with the well, and sidewall portions of the doped polysilicon fill are electrically isolated from portions of sidewalls of the lower portion of the trench by an electrical insulating layer.

Viewed from still an other aspect, the present invention is directed to a dynamic random access memory comprising a monocrystalline silicon chip including a plurality of active areas in each of which there is included a pair of transistors and a pair of separate storage trenches for providing a storage capacitor for each of the transistors and a continuous isolation trench. The continuous isolation trench is located in the silicon chip and isolates from one another the active areas, the storage trenches being filled with doped polysilicon of one conductivity type. The isolation trenches has an upper portion filled with a dielectric material and a lower portion filled with doped polysilicon of the conductivity opposite said one conductivity type and connected to a portion of the silicon chip. A lower portion of the doped polysilicon fill makes electrical contact with the silicon chip, and side wall portions of the doped polysilicon fill are electrically isolated from portions of sidewalls of the lower portion of the trench by an electrical insulating layer.

Viewed from a process aspect, the present invention is directed to a method of providing electrical isolation for semiconductor structures contained in a semiconductor body. The method comprises the steps of forming an isolation trench in a portion of the semiconductor body which encircles an area of the semiconductor body, lining sidewalls of a lower portion of the trench with an electrical insulator, filling the lower portion of the isolation trench with a conductive material having a lower portion that which makes electrical contact with the semiconductor body and having other portions which are electrically isolated from the sidewalls of the lower portion of the isolation trench by the electrical insulator, and filling an upper portion of the isolation trench with an electrical insulator.

Viewed from an other process aspect, the present invention is directed to a method for making memory cells in a semiconductor body of one conductivity type. The method comprises the steps of providing a patterned PAD layer over a top surface of the semiconductor body that defines active areas in which memory cells are to be formed, and a continuous field shield isolation trench area, forming storage trenches in the active areas and filling each with doped polysilicon that is of the conductivity type opposite that of the one conductivity and that is electrically isolated from the monocrystalline silicon except at a strap region, forming a continuous isolation trench in the isolation trench area, forming an electrical insulating layer on sidewalls of a lower portion of the isolation trench, filling a bottom portion of the isolation trench with doped polysilicon that is of the one conductivity type and that is electrically isolated from the semiconductor body except at the bottom of the isolation trench, filling the upper portion of the isolation trench with silicon oxide, forming in each active area a pair of metal-oxide-semiconductor field effect transistors having source and drain regions that are spaced apart and that are each of the opposite conductivity type of the one conductivity type, and providing a conductive connection between the source of each transistor and the polysilicon fill of a storage trench by way of a strap region.

The invention will be better understood from the following more detailed description taken in conjunction with the accompanying drawing.

Figure 1:
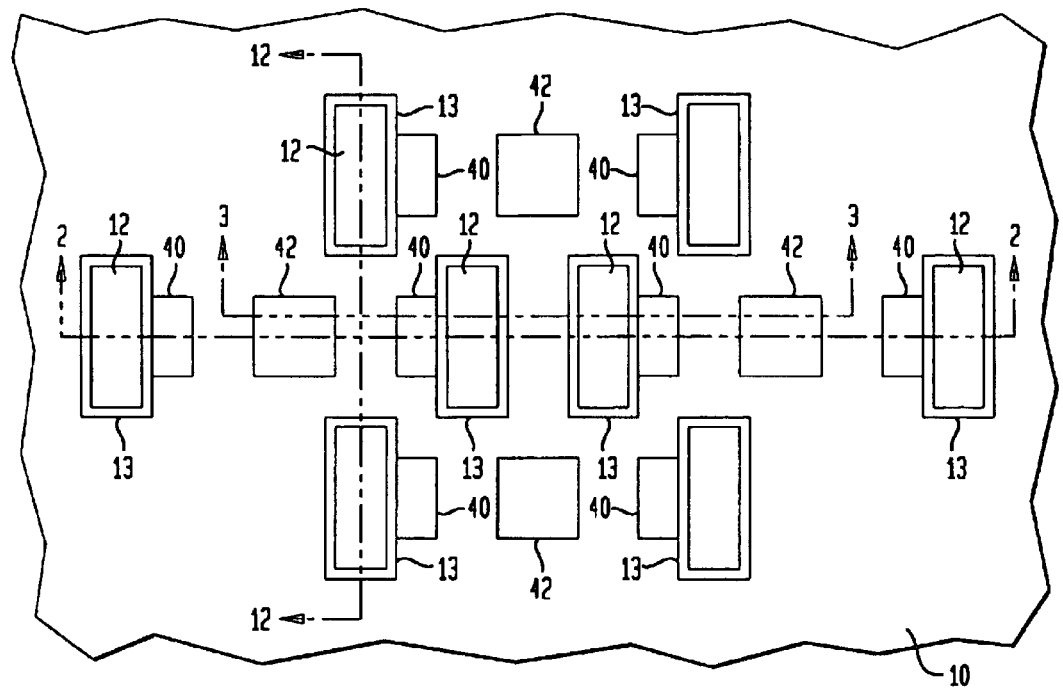
FIGS. 1 through 12 each show a semiconductor body (e.g., a silicon workpiece, substrate, chip) at various stages in the forming therein of an array of pairs of memory cells in accordance with the present invention with FIG. 1 being a top view, FIG. 2 being a cross sectional through a dashed line 2—2 of FIG. 1, FIG. 3 being a cross sectional view through a dashed line 3—3 of FIG. 1, FIG. 4 being a top view, FIGS. 5–11 being cross sectional vies through dashed line 4—4 of FIG. 4, FIG. 12 being cross sectional view through a dashed line 12—12 of FIG. 1.

The drawing is not necessarily to scale.

DETAILED DESCRIPTION

Figure 2:
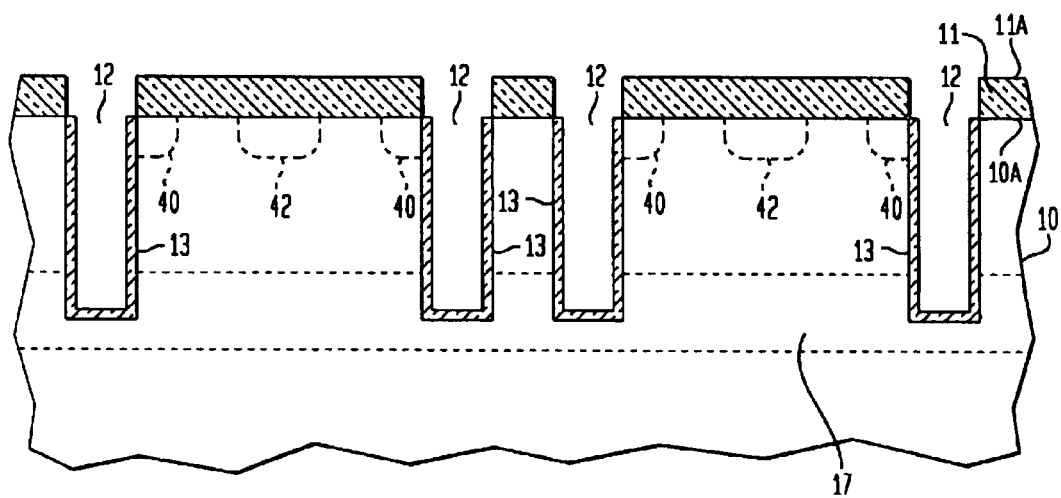

FIGS. 1 and 2 show a top view and a cross sectional view, respectively; of a semiconductor body 10 using field-shield isolation around semiconductor structures in accordance with the present invention. The cross sectional view of FIG. 2 is that taken through a dashed line 2—2 of FIG. 1. By a semiconductor structure is meant any electrical component and/or circuit which can be formed in a semiconductor body. In the illustrative embodiment the semiconductor structure is a memory portion of a dynamic random access memory (DRAM) formed in semiconductor body (substrate, chip) 10 (e.g., a portion of monocrystalline silicon wafer) having a top surface 10A (shown in FIG. 2) in which there are to be a memory array of rows and columns of pairs of memory cells that each comprise a transistor and a storage capacitor of the trench type and which use the field-shield isolation of the present invention. FIG. 1 is a somewhat simplified from a true view so as to make it easier to understand the field-shield isolation of the present invention. It does not show word and bit lines of the DRAM and the gates and gate dielectric layers of the transistors.

As is known, typically many DRAMs, each including millions of memory cells, are simultaneously formed in a single wafer and the wafer is subsequently diced into many chips, each typically including one or more DRAMs. The DRAM being described as illustrative of the invention uses n-channel metal-oxide-semiconductor field effect transistors (NMOSFETS), which currently are standard because of their inherent speed advantage over p-channel MOSFETS. These are formed in a monocrystalline p-type conductivity region, which may, for example, be either a moderately doped p-type conductivity well formed in a more lightly-doped p-type conductivity substrate, a p-type conductivity region on an n-type conductivity layer on a p-type conductivity substrate, a p-type conductivity region on an n-type conductivity substrate, an epitaxial monocrystalline p-type conductivity region formed on an insulating substrate, such as quartz, or a p-type conductivity substrate with a deep buried n-type conductivity layer.

The illustrative embodiment described herein below uses a semiconductor body 10 which is of p-type conductivity and has a deep buried n+ type layer 17 formed in a portion thereof which underlies a portion which memory cells occupy. The portion of the semiconductor body 10 above the n+ type buried layer 17 is denoted a p-type well or just as a well.

In an illustrative embodiment, the semiconductor body 10 shown in FIGS. 1 and 2 is formed as follows. First there is formed over a top surface 10A of a p-type semiconductor body 10 a "PAD" layer 11 that typically comprises a lower thinner layer of silicon oxide and an upper thicker layer of silicon nitride. For simplification, in the drawing the PAD layer 11 is shown as a single layer. This layer is then patterned to expose regions where deep storage trenches 12 are to be formed, typically by anisotropic reactive ion etching (RIE) to provide vertical side walls to the storage trenches 12, as is shown in FIG. 2.

These deep storage trenches 12 are used to form the storage capacitors of the memory cells. After each storage trench 12 is in place, it is generally lined with a relatively thin insulating layer 13 that will serve as the node dielectric of the capacitor to be formed in the storage trench 12. The dielectric layer 13 typically is either a layer of silicon oxide, a layer of silicon nitride, or a layer containing both silicon oxide and silicon nitride. FIG. 1 shows just parts of three rows of memory cells of the DRAM. The first (upper) row shows two storage trenches 12 with each having a dielectric layer 13 covering walls thereof, a common drain region 42, and a separate source region 40 adjacent each of the trenches 12. This combination represents two memory cells with each comprising a trench capacitor formed in a storage trench 12 and an n-channel metal-oxide-semiconductor (MOS) transistor that has a n+ type conductivity drain region 42 and an n+ type conductivity source region 40. Both transistors share the common drain region 42. The designation of drain and source regions reverse from a write-in operation to a read-out operation. Thus drain region 42 becomes source region 42 during a read-out operation of the memory cell and source region 40 becomes drain region 40 during a readout operation of the memory cell. A separate gate dielectric layer and gate (not shown in FIGS. 1 and 2) are formed between the drain region 42 and each source region 40. The third (lower) row contains the same configuration as shown in the upper row. The area occupied by each of these pairs of memory cells and the portions of the semiconductor body 10 immediately there around is denoted as an active area. The middle row contains two pairs of memory cells. Each of the active areas is isolated from the others by a continuous field shield of the present invention which is described in detail herein below.

In the illustrative example, the pairs of memory cells of one row are staggered from those of an adjacent row and each pair of memory cells share a common drain region 42. This layout has been found to be efficient with respect to area of silicon used. The layout is amenable to the well known folded bit line architecture which provides superior noise immunity with respect to open bit line architecture. It is possible and feasible to use the present field shield with open bit line layouts, as well as with single memory cells which do not share a common drain region and which are in conventional rows and/or columns.

Figure 3:
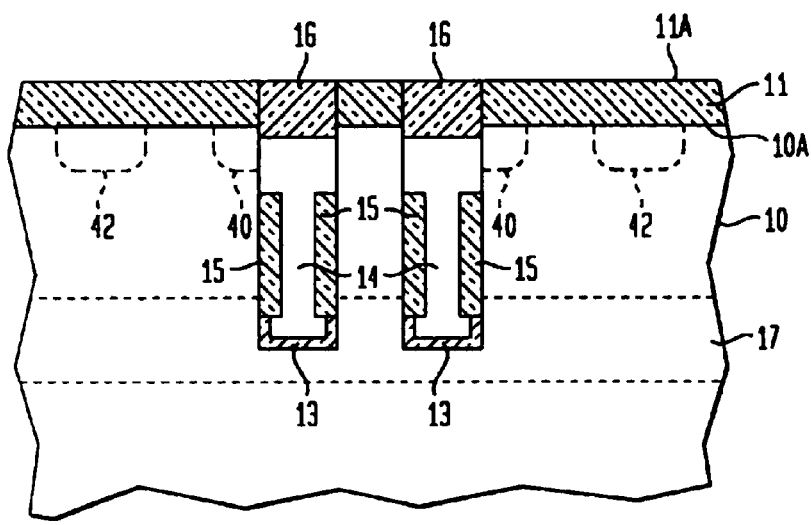

As is shown in cross sectional view of semiconductor body 10 of FIG. 3, which is a cross sectional view taken through a dashed line 3—3 of FIG. 1, the process continues and each of the storage trenches 12 is filled with n+ type conductivity doped polysilicon 14. To achieve a good fill, the polysilicon 14 typically is deposited to overfill the storage trenches 12 and extend above a top surface 11A of layer 11 and then planarized to the top surface 11A of the PAD layer 11 level by chemical mechanical polishing (CMP).

There is then provided a dielectric collar 15, typically a thicker layer of silicon oxide, along an intermediate portion of each of the storage trenches 12. To this end, a recess is formed in the polysilicon fill 14 to the depth desired for the bottom edge of the oxide collar 15, also typically by anisotropic reactive ion etching (RIE). Then the portion of the layer 13 in the region where the collar is to be formed and therebove is removed. Then a silicon oxide layer is then formed over the sidewalls of each of the storage trenches 12 exposed by the recess. Then an anisotropic etch is used to remove the silicon dioxide layer from all horizontal surfaces. The recess is then refilled with doped n-type polysilicon in the manner of the original fill. Now a new recess formed to a depth corresponding to that desired for the top of the dielectric collar 15. Then there is etched away the exposed silicon dioxide layer to the top of the desired collar 15 such that the remaining silicon dioxide layer becomes the collar 15. After this, the last-formed recess is refilled with an n-doped polysilicon and this fill advantageously is similarly recessed to slightly below the surface 10A. Finally, this recess is filled, advantageously with silicon dioxide 16, typically formed from TEOS decomposition, and acts as a dielectric capping layer. After the filling, the surface is planarized.

The result is shown in FIG. 3 with the deeper major portion of each deep storage trench 12 filled with n-doped polysilicon 14 and a shallow minor top portion filled with silicon oxide 16, and with a collar layer 15 of silicon oxide formed in the polysilicon 14 portion of each of the storage trenches 12. Only the two central adjacent storage trenches 12 and a limited portion of semiconductor body 10 are shown in FIG. 3 to simplify the drawing. All subsequent figures, except for FIG. 11, will also only show these two storage trenches 12 and a limited portion of the semiconductor body 10 there around. It is to be noted that the areas of semiconductor body 10 between adjacent storage trenches 12, other than areas in which transistors are located, will contain portions of the field shield being fabricated between the two storage trenches 12 shown in FIG. 3.

Figure 5:
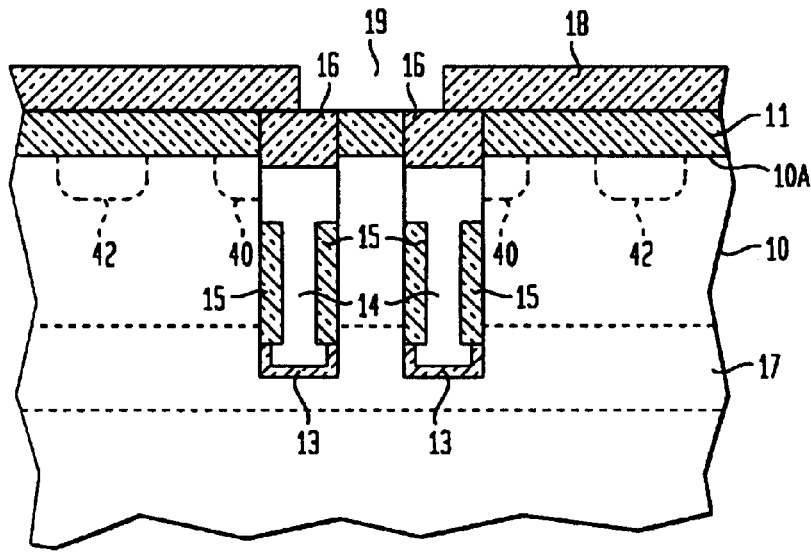
Figure 4:
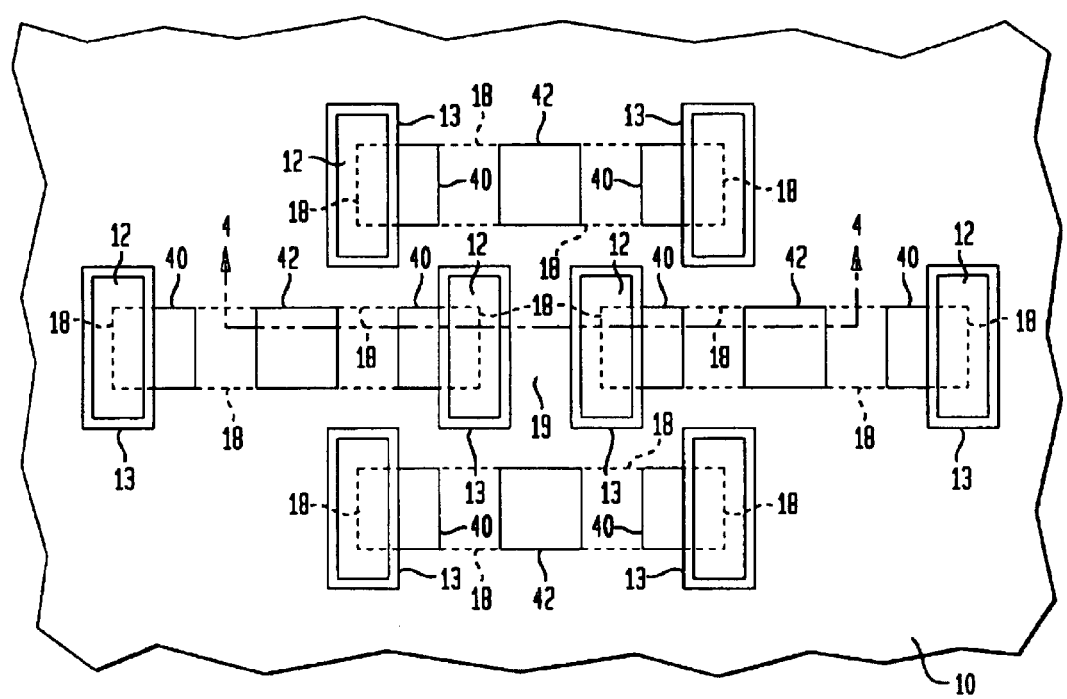

FIG. 4, which is a top view, and FIG. 5 which is a cross sectional view taken through a dashed line 4–4 of FIG. 4, show the process continuing with a layer of a suitable mask material 18, such as a photoresist, deposited over the top surface 11A of layer 11 as shown to overlie the regions in which pairs of transistors are to be formed between the storage trenches 12 as previously described. An opening in the mask layer 18 leaves unmasked a central region 19 between central trenches 12 of the middle row of memory cells as well as openings around all portions of mask material 18 (shown as dashed line rectangles in FIG. 4).

With the photoresist 18 and the silicon dioxide layers 16 as a mask, there is then etched, typically by anisotropic RIE, the exposed portion of PAD layer 11 and the underlying, now unprotected silicon between the silicon dioxide layers 16.

Figure 6:
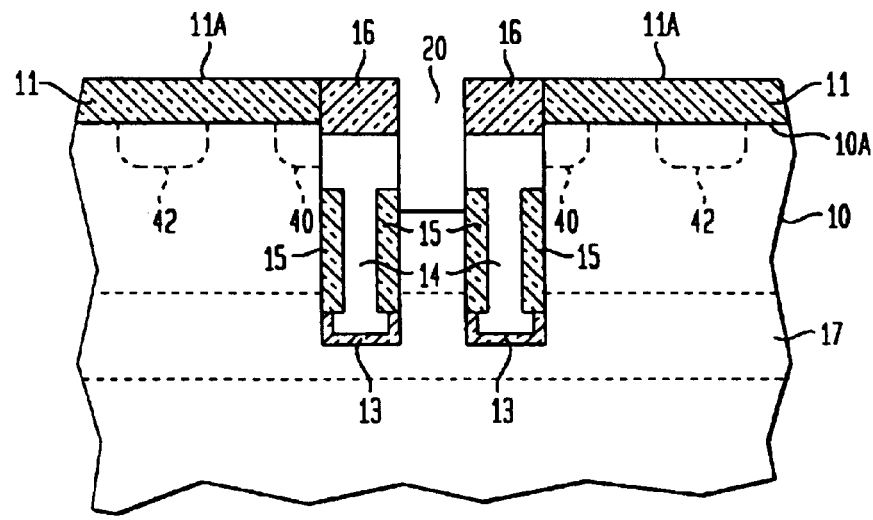

After such etching, the photoresist mask 18 is removed with the result shown in FIG. 6, where there is shown an isolation trench 20 formed in the semiconductor body 10 where not protected either by the photoresist layer 18 or by the silicon dioxide regions 16 deposited from TEOS. This isolation trench 20 is self aligned to the sidewall edges of the deep storage trenches 12 also exists between rows of memory cells and advantageously is deeper than was the typical depth of the shallow trench used in standard STI. In particular, it is advantageous to have this isolation trench 20 be deeper than the top of the dielectric collar 15, as is shown in FIG. 6.

Figure 7:
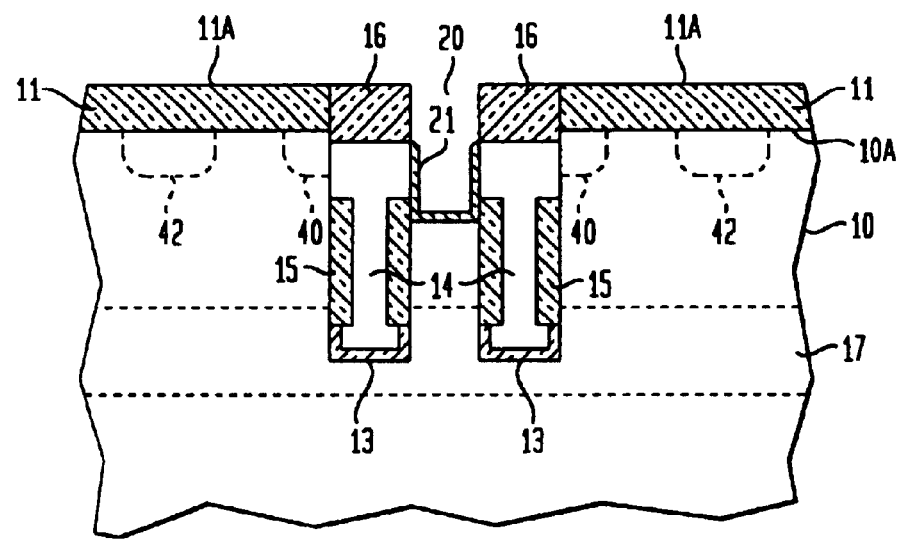

Then the surface of the polysilicon fill of the deep storage trenches 12 and the silicon which will contain the MOSFETS exposed by isolation trench 20 is oxided to form a field shield dielectric layer 21, as is shown in FIG. 7. Layer 21 is preferably thermally grown silicon dioxide.

Figure 8:
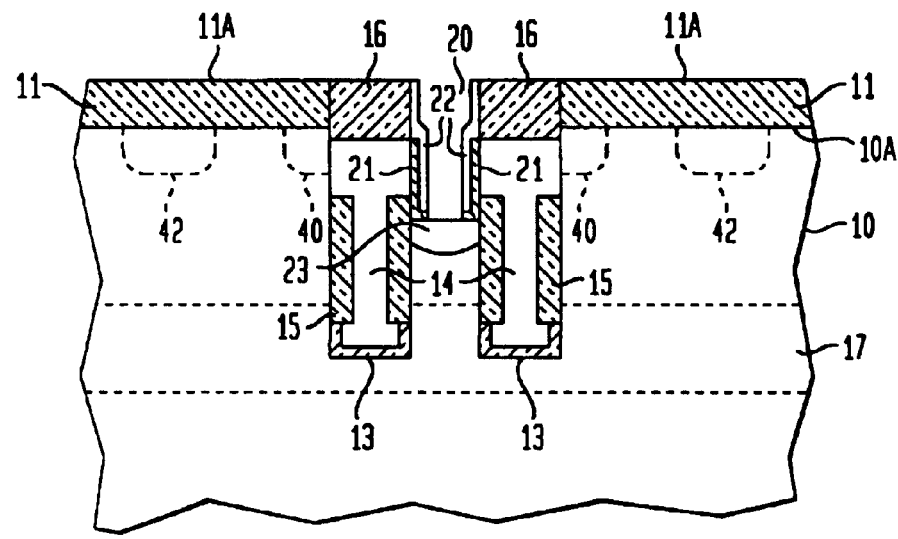

Then thin spacers 22, either of undoped or lightly doped p-type polysilicon are formed on the vertical side walls over the field dielectric layer 21, as is shown in FIG. 8. Typically this is done by first depositing a layer of polysilicon in the isolation trench 20 and then using anisotropic reactive ion etching to form polysilicon sidewall spacers. The spacers 22 surround all of each of the storage trenches 12 including the portions thereof in which transistors are formed and in areas of semiconductor body 10 immediately surrounding the transistors. Now it is advantageous, although not essential, to implant selectively through silicon dioxide layer 21 at the bottom of recess 20 to form a more heavily doped p+ type conductivity region 23 in the semiconductor body 10 at the bottom of the recess 20. Then the exposed bottom portion of thin field shield silicon oxide layer 21 between the polysilicon spacers 22 is removed to expose monocrystalline silicon 23 at the bottom of isolation trench 20, as is shown in FIG. 8.

Figure 9:
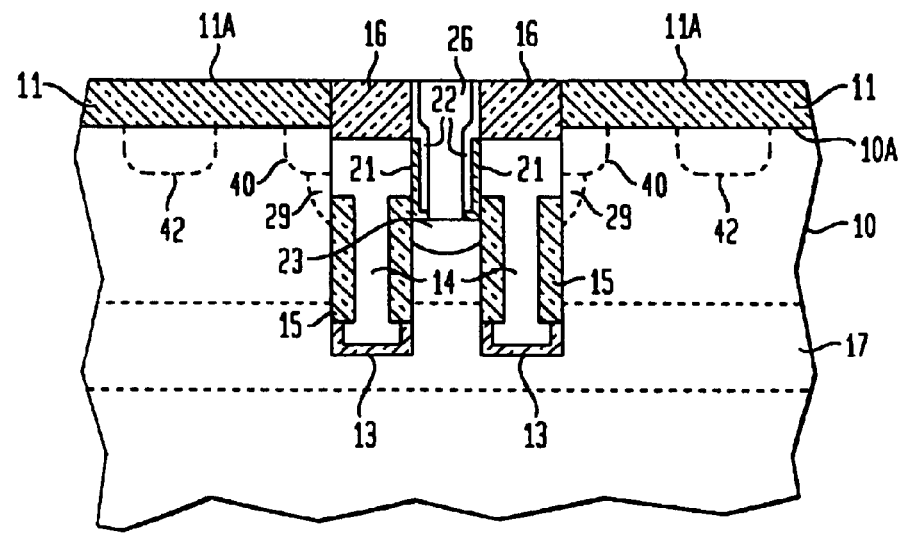

Now, as is shown in FIG. 9, a layer of heavily doped p+ type conductivity polysilicon 26, typically of a concentration of between $10^{19}$–$10^{21}$ cm$^{-3}$ acceptors, is deposited to fill the space in the isolation trench 20 between the polysilicon spacers 22. Again this is best done by depositing the doped silicon to overfill the isolation trench 20 and then planarizing the surface. It is a portion of this p+ type layer 26 of doped polysilicon that completes the field-shield portion of the isolation trench 20. This p+ type doped polysilicon 26 completely surrounds the active areas of the two transistors and storage trenches 12 of each pair of memory cells which includes the common drain region 42 and source regions 40 and the gates and gate dielectric layers (not shown in this figure). The height of this field-shield silicon layer typically is between 150–1000 nanometers, and preferably between 200–500 nanometers. The top surface of the field shield is recessed to a pre-determined depth.

Figure 13:
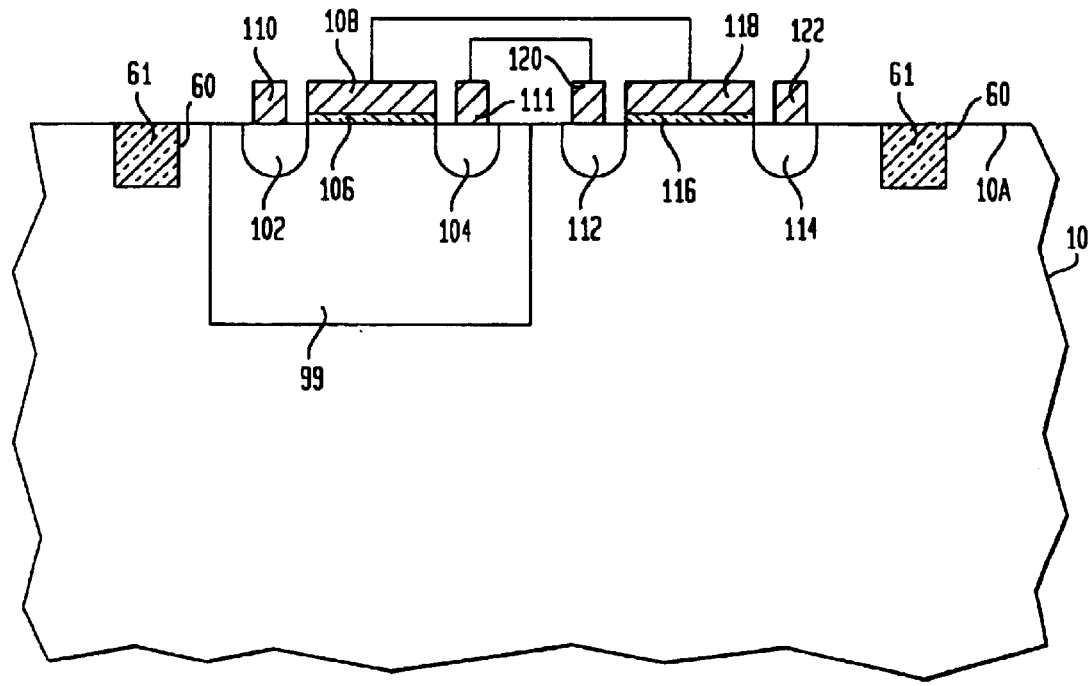
FIG. 13 is a cross sectional view of a peripheral of the semiconductor body which contains support circuitry for the memory cells of FIG. 1

At this point, it is usually advantageous to define active areas of support circuits, typically a mixture of n-channel and p-channel MOSFETs located in a peripheral portion of the semiconductor body 10 of the DRAMs and to etch away the PAD layer in these peripheral portions, while masking the memory portion of semiconductor body 10 of the DRAM. FIG. 13, which is described herein below, shows one illustrative cross sectional view of a peripheral portion of semiconductor body 10.

Figure 10:
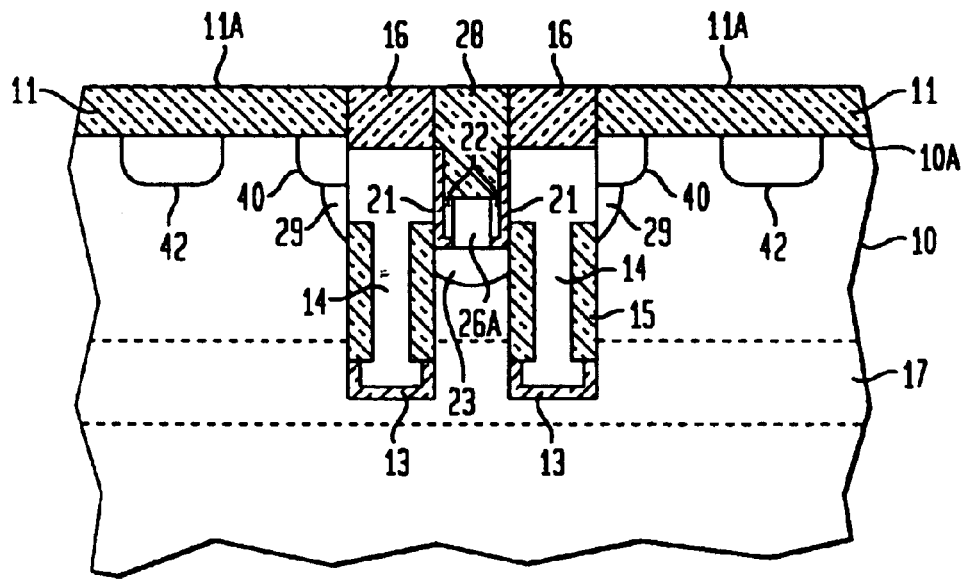

After the PAD layer 11 is opened in the peripheral portion and the masking layer is removed, the polysilicon 26 in the array area and the exposed silicon in the peripheral support areas are etched to leave a portion of polysilicon 26A, typically to a depth slightly deeper than the depth of either the drain region 42 or the p and n junctions of the MOSFETs in the support circuitry (See FIG. 13). Then these recesses created in the monocrystalline silicon in the support regions and in the isolation trenches 20 are filled in the usual fashion, typically overfilling with silicon oxide 28 that is deposited by chemical vapor deposition (CVD) and then planarized, and densified if desired. The result is shown in FIG. 10. The silicon dioxide fill 28 overlies the doped polysilicon field shield layer 26A and provides the STI layer of the isolation trench 20. The depth of layer 28 helps assure that there will be negligible contribution to the capacitance of the drain region 42 and a bit line 54 (See FIG. 11) coupled thereto.

After there has been formed the shallow trench isolation layer 28 over the field-shield polysilicon 26A, the source region 40 and drain region 42 of the NMOSFET of each of the memory cells are formed, in conventional manner.

Typically, this first involves removal of the PAD layer over the active area to expose the monocrystalline silicon where the transistors are to be formed. Then grow a sacrificial oxide and implant the wells. Then strip the sacrificial oxide and form a thin oxide over the exposed silicon suitable for use as the gate dielectric layer 50A of the transistors. This is preferably done by thermal oxidation of silicon. Next there follows deposition of the gate conductor stacked doped polysilicon and a sidewall capped with an insulator over the gate dielectric layer 50A and patterning of this gate stack to define the gate electrode 51 of each transistor. Using the gate electrode 52 as an implantation mask, there are then formed the n+ type source region 40 and drain regions 42 of each transistor in the usual fashion. During the course of the formation of the transistor, enough n-type dopants typically diffuse from the n+ polysilicon fill 14 in the deep trench 12 by way of the region above the top of the collar 15 to form an n-type conductive strap 29 between the source region 40 of the transistor in the monocrystalline silicon and the polysilicon fill 14 of the deep storage trench 12 that serves as the storage node of the memory cell.

The field shield is particularly effective, without need for unduly raising the required well doping concentration, as long as the depth of the conductive strap diffusion 29 within the semiconductor body 10 is relatively shallow (i.e., no deeper beyond the bottom of the field shield than approximately 10–20 times the thickness of the dielectric between the field shield and the monocrystalline silicon.

Figure 11:
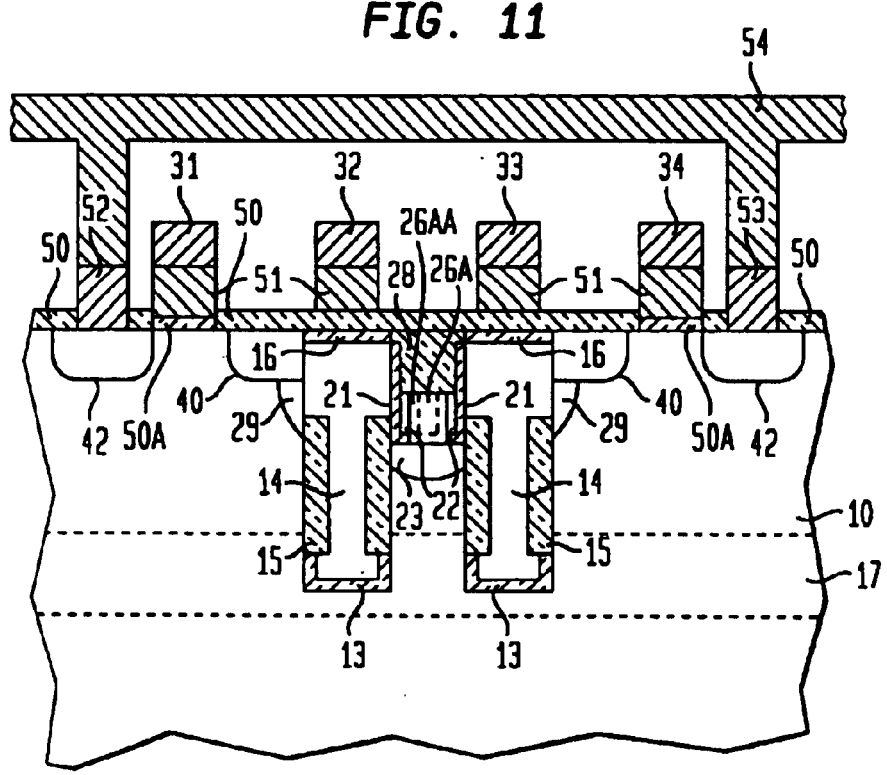

There are then formed in known fashion over the top of the semiconductor body 10 various conductive wiring levels that form several word lines 31, 32, 33, and 34, drain contracts 52 and 53, and a bit line 54 coupled to the drain contacts 52 and 53 of the DRAM, as is shown in FIG. 11. Of these, word lines 31 and 34 serve the two transistors shown in FIG. 11 while word lines 32 and 33, which are denoted as passing word lines, serve the transistors in the upper and low rows (not shown in FIG. 11).

Since the heavily doped p-type field shield regions 26A provide superior active isolation of the deep portion of the p-type well, it becomes feasible, if desired, to use deeper conductive buried straps 29 than would otherwise be the case with STI alone. Such deeper straps 29 can make for a lower resistance connection between the source region 40 and the storage node provided by deep trench fill 14 and also improve the ability to tolerate variations in strap depth. Furthermore, the use of field-shield-trench isolation allows for reduced well doping in the array, which reduces junction leakage and improves yield.

Polysilicon fill 26A can be replaced by portion thereof 26AA which is shown in FIG. 11 by a dashed line which defines a U-shaped volume which would be filled by silicon dioxide fill 28.

The use of the field shields as described also facilitates the formation of vertical transistors along the vertical side walls of the deep trenches, if this be desired. There is growing interest in such vertical transistors to save the space the horizontal transistors typically consumed on the top surface area of the semiconductor body.

Moreover, because the STI trenches to be filled with silicon oxide can be shallower, they can be easier to fill. Also, as mentioned earlier, the improved compatibility of the thermal match between the monocrystalline silicon of the active areas and the polysilicon field shield regions should make for fewer silicon defects in the monocrystalline active area than when only silicon oxide was used for memory cell isolation.

Figure 12:
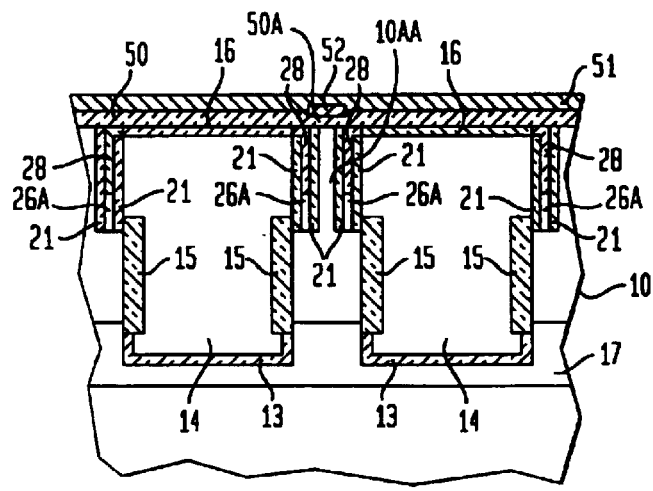

FIG. 12 shows a somewhat simplified cross sectional view through a dashed line 4—4 of the semiconductor body 10 shown in FIG. 4, after the formation of word lines and bit lines (both not shown in FIG. 1). This view cuts through storage trench 12 of the upper row, a bit line 64 (not shown in FIG. 4), a gate 51 (not shown in FIG. 4), and a gate oxide dielectric layer 50A (not shown in FIG. 4) of a transistor of the middle row and an storage trench 12 of the lower row. Also shown in FIG. 12 is the deep n+ type conductivity layer 17, which is preferably included in the semiconductor body 10 during the formation of the deep storage trenches 12 used for the storage capacitor. Layer 17 serves as an outside plate of each storage capacitor formed by the deep storage trench 12 with the fill 14 being the inner plate. The n+ type plate is typically maintained at a potential midway between the highest and lowest voltages expected on the bit line in a suitable fashion. These typically range between 0 and 1.5 volts. Spacers 22, which are sandwiched between layer 21 and conductive fill 26A, are not shown in FIG. 12 to simplify the drawing.

In a presently preferred embodiment, layer 17 extends across the entire bottom portion of the memory array area of semiconductor body 10 and a surrounding n-well region extends down vertically so as to essentially electrically isolate the memory portion of semiconductor body 10 from the rest of semiconductor body 10. This effectively forms an electrically isolated p-type conductivity well within semiconductor body 10 and allows the voltage bias applied to the well portion of semiconductor body 10 to be different than that applied to the rest of semiconductor body 10. Typically −0.5 to −1.0 volts is applied to the well and ground potential is applied to the other portions of semiconductor body 10. This facilitates lower leakage with the memory portion (i.e., the well) of the semiconductor body 10. Typically this more negative potential is applied to region 23 via an extension thereof (not shown) which intersects surface 10A.

FIG. 13 shows a cross sectional view of a peripheral portion of semiconductor body 10 which uses an isolation trench 60 filled with silicon dioxide 61 in accordance with the present invention to electrically isolate peripheral circuits containing both n-channel and p-channel MOSFETS in semiconductor body 10 from the memory cells contained in the memory portion. These circuits are typically used to control the memory cells previously discussed herein above.

An n-type conductivity well (region) 99 is shown formed within a portion of semiconductor body 10 with a p-channel MOSFET formed therein. Within well 99 are a p+ type conductivity source region 102 and a p+ type conductivity drain region 104 which are separated by portions of well 99. A gate dielectric layer 106 is on surface 10A and extends between source region 102 and drain region 104. A gate 108 covers a gate dielectric layer 106. Electrical contacts 110 and 111 are connected to the source region 102 and to the drain region 104, respectively. An n-channel MOSFET is formed in an other portion of the peripheral portion of semiconductor body 10. The n-channel MOSFET comprises a n+ type conductivity drain region 112 separated by portions of semiconductor body 10 from an n+ type conductivity source region 114. A dielectric gate layer 116 extends alone surface 10A between the drain region 112 and the source region 114 and is covered by a gate 118. Separate electrodes 120 and 122 are connected to drain region 112 and source region 114, respectively. The gates 108 and 118 of the two transistors are electrically connected together and the drains regions 104 and 112 are electrically connected together to form an inverter. Electrode 110 is typically connected to a positive voltage source (not shown) used with the DRAM and electrode 122 is typically connected to a reference potential that in one illustrative example is ground. As such this configuration of two transistors provide an inverter function such that with a logical "1" applied to gates 108 and 118, a logical "0" appears at the electrodes 110 and 120, and with a "0" applied to the gates 108 and 118, a logical "1" appears at the drain regions 104 and 120. This circuit is typically denoted as a complementary metal-oxide-semiconductor (CMOS) inverter.

The isolation trench 60 surrounds both transistors and is filled with silicon dioxide 61 so as to electrical isolate these transistors and the circuit they comprise from other transistors or components in the peripheral portion of the semiconductor body 10. In a presently preferred embodiment the height of silicon dioxide fill 61 is typically somewhat greater than the depth of the drain and source regions 102, 104, 112, and 114, but is in an illustrative embodiment preferably less than the thickness of layer 28 of FIG. 11. This achieved as follows. After fill 26 of FIG. 9 is planarized with surface 11A of layer 11, it is etched to a lower level. Then isolation trench 60 and the remainder of layer 26 are both etched together. Trench 60 is then filled with fill 61 and the recess in above polysilicon portion 26A is filled with fill 28.

It is to be understood that the specific embodiment that has been described is illustrative of the general principles of the invention. Various other embodiments can be devised without departing from the spirit and scope of the invention. For example, there may be used for shallow trench isolation dielectric materials other than silicon oxide. Still further, the field shield of the present invention can be used in memory cells that use a p-channel MOSFET as the transistor or that use a storage capacitor that has been formed on the top surface of the chip by a multilayer stack, as is sometimes practiced in the art, in place of a deep trench capacitor. Still further, a wide variety of electrical insulators, such as silicon nitride, silicon oxynitride, or layer of such be substituted for the silicon dioxide 21 used in the lower portion of isolation trench 20 or the field shield dielectric. Still further, a wide variety of conductors, such as a composite of polysilicon and a silicide can be substituted for the doped polysilicon 26A used in the lower portion of isolation trench 20. Furthermore, semiconductor structures other than memory cells can be isolated using the field shield of the present invention. These structures include, not are not limited to, bipolar transistors, junction field effect transistors, diodes, resistors, capacitors, and/or a wide variety of circuits which use these and/or other components.

What is claimed is:

1. A semiconductor body containing at least one semiconductor structure, said semiconductor body comprising:
    an isolation trench formed in said semiconductor body and having a bottom and sidewalls, said isolation trench enclosing an area of the semiconductor body which contains said semiconductor structure so that the semiconductor structure is electrically isolated from other semiconductor structures that are also contained within the semiconductor body but which are not located within the enclosed area;
    a lower portion of the isolation trench being at least partly filled with an electrically conductive material, sidewall portions of said electrically conductive material being at least partly separated from the sidewalls of the lower portion of the isolation trench by a first electrical insulator, a lower region of said electrically conductive material being in electrical contact with the semiconductor body at the bottom of said isolation trench; and
    a remaining portion of the isolation trench being filled with a second electrical insulator.

2. The semiconductor body of claim 1 wherein the electrically conductive material includes doped polysilicon.

3. The semiconductor body of claim 1 wherein said first electrical insulator includes silicon dioxide.

4. The semiconductor body of claim 1 wherein said second electrical insulator includes silicon dioxide.

5. The semiconductor body of claim 1 wherein a region of said semiconductor body that is adjacent to said bottom of said trench is more heavily doped than a remaining portion of said semiconductor body.

6. The semiconductor body of claim 1 wherein a region of said semiconductor body that is adjacent to said bottom of said trench is of a same conductivity type as said electrically conductive material.

7. The semiconductor body of claim 1 wherein the at least one semiconductor structure includes a conductive buried strap region, and said bottom of said isolation trench is at least as deep as a bottom of said conductive buried strap region.

8. The semiconductor body of claim 1 wherein said first electrical insulator includes undoped polysilicon.

9. An isolation structure formed in a semiconductor body for electrically isolating at least one semiconductor structure from another semiconductor structure; said isolation structure comprising:
    an isolation trench formed in the semiconductor body and enclosing an area of said semiconductor body that includes said semiconductor structure, said isolation trench having sidewalls and a bottom;
    an electrically conductive material at least partly filling a lower portion of said isolation trench and in electrical contact with the semiconductor body at said bottom of said isolation trench;
    a first electrically insulating layer formed on said sidewalls of said isolation trench to at least partly separate said electrically conductive material from said sidewalls of said isolation trench; and
    a second electrically insulating layer filling a remaining portion of said isolation trench.

10. The isolation structure of claim 9 wherein said electrically conductive layer includes doped polysilicon.

11. The isolation structure of claim 9 wherein said first electrically isolating layer includes silicon dioxide.

12. The isolation structure of claim 9 wherein said first electrically isolating layer includes undoped polysilicon.

13. The isolation structure of claim 9 wherein said bottom of said isolation trench contacts a region of the semiconductor body that is more heavily doped than a remaining portion of the semiconductor body.

14. The isolation structure of claim 9 wherein said electrically conductive material is of a same conductivity type as a region of the semiconductor body that adjoins said bottom of said isolation trench.

15. The isolation structure of claim 9 wherein said bottom of said isolation trench is at least as deep as a bottom of a conductive buried strap which comprises part of the semiconductor structure.

* * * * *

UNITED STATES PATENT AND TRADEMARK OFFICE
CERTIFICATE OF CORRECTION

PATENT NO. : 6,762,447 B1  
DATED : July 13, 2004  
INVENTOR(S) : Jack A. Mandelman et al.

It is certified that error appears in the above-identified patent and that said Letters Patent is hereby corrected as shown below:

Title page,
Item [75], Inventors, "Larosa" should read -- LaRosa --.

Signed and Sealed this

Fourteenth Day of December, 2004

JON W. DUDAS
*Director of the United States Patent and Trademark Office*